United States Patent
Cui et al.

(10) Patent No.: US 9,478,313 B2
(45) Date of Patent: Oct. 25, 2016

(54) FAST SEMANTIC PROCESSOR FOR PER-PIN APG

(71) Applicant: Advantest (Singapore) Pte. Ltd., Singapore (SG)

(72) Inventors: Huachun Cui, Singapore (SG); Kazi Iftekhar Ahmed, Singapore (SG)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/333,022

(22) Filed: Jul. 16, 2014

(65) Prior Publication Data
US 2015/0194223 A1      Jul. 9, 2015

(30) Foreign Application Priority Data

Jul. 16, 2013  (CN) .......................... 2013 1 0298422

(51) Int. Cl.
| | | |
|---|---|---|
| *G06F 11/22* | (2006.01) | |
| *G06F 17/50* | (2006.01) | |
| *G11C 29/10* | (2006.01) | |
| *G11C 29/56* | (2006.01) | |

(52) U.S. Cl.
CPC ......... *G11C 29/10* (2013.01); *G11C 29/56004* (2013.01)

(58) Field of Classification Search
USPC .................. 714/703; 702/120, 108; 716/136
See application file for complete search history.

(56) References Cited

U.S. PATENT DOCUMENTS

| | | | | |
|---|---|---|---|---|
| 7,184,917 B2* | 2/2007 | Pramanick | ......... | G01R 31/3183 702/108 |
| 7,761,751 B1* | 7/2010 | West | ................ | G01R 31/31908 714/703 |
| 2005/0251359 A1* | 11/2005 | Cao | ........................ | G06F 11/273 702/120 |
| 2006/0074625 A1* | 4/2006 | Maeda | ..................... | G06F 8/20 704/8 |

* cited by examiner

*Primary Examiner* — Brian Ngo

(57) ABSTRACT

System and method for implementing a memory test language compiler. The compiler includes a fast semantic processor for interpreting programming patterns in a test program, including converting stateful patterns into stateless patterns, and a device access timing generation module for generating an output based on the stateless patterns. The fast semantic processor can generate a closure for a device access line as the output. In the state of the closure, each device access line is in a closed state. A functor is formed from the interdependency of the variables and the loop dependency and a cache is used to handle recursive variables. The functor is propagated to device access lines as output, wherein the functor references the cache when needed.

17 Claims, 2 Drawing Sheets

FAST SEMANTIC PROCESSOR FOR PER-PIN APG

CROSSREFERENCE

This application claims the benefit of Chinese Application No. 201310298422.7 entitled "Fast Semantic Processor for Per-pin APG" filed on Jul. 16, 2013, which is incorporated herein by reference.

TECHNICAL FIELD

The following generally relates to testing of integrated circuits, and more particularly to a fast semantic processor for per-pin APG (Automatic Pattern Generator).

BACKGROUND

A test processor can be used in smart test of an IC (Integrated Circuit) such as a memory or SoC (System on Chip) IC. However, usually there is no register unit or calculation unit in the test processor and so conditional execution cannot be performed. The test processor typically can only execute a nested repeat tree like the following:

```
repeat 10{
    100 vectors
    repeat 5{
        1024 vectors
    }
    30 vectors
}
``` wherein "repeat" represents an act of repeating, for example, "repeat 10" representing repeating 10 times the content in the parentheses thereafter; and "vector" represents a data vector. By executing the repeat tree, the test processor can generate the binary sequence for the test. The test processor includes, for example, a repeat tree execution module that converts the repeat tree into a binary sequence, and an excitation signal generation module that generates an excitation signal to be input into a test device based on the binary sequence.

An MTL (Memory Test Language) compiler is typically used to convert a test program written in a test language into a repeat tree. Because an MTL compiler can generate a repeat tree for each pin, it is also commonly referred to as a per-pin algorithmic pattern generator (APG).

The test language could be C language or any other suitable language. C language and other language similar to C language will be referred to as C-style language hereinafter, and an illustration will be made by example of C-style language. In this case, the MTL compiler converts C-style programming patterns (a C-style program) into repeat trees for respective pins, an example of which is as follows:

```
for (i = 0; i<1024, i++)
{
    dev_acc(i);              pin0: repeat 512{HL}
}
                        ⇒
:apgAccess:                  pin1: repeat 256{0011}
{      :interface: i
    pin0 {H,L} i[0]
    pin1 {0,1} i[1]
}
``` wherein "dev_acc" references to a device access timing generation module in the MTL compiler, "apgAccess" is an instance of the device access timing generation module, and "pin 0: repeat 512 {HL}" and "pin1: repeat 256{0011}" on the right side represent repeats (or repeat trees in complex cases) executed for pin No. 0 and pin No. 1, respectively, which are also called device access lines. In this manner, the above test program is converted into repeat trees for respective pins.

An MTL compiler typically includes a semantic processor and one or more device access timing generation modules. The semantic processor can interpret the programming patterns (program sentences) of a test program. Then, the device access timing generation module converts the interpreted patterns into repeat trees for respective pins based on information (for example, timing information) contained in the device access timing generation module about the respective pins. The information can be stored in advance, or can be provided externally based on characteristics of the pins of a Device Under Test (DUT).

In a typical MTL compiler, the semantic processor performs semantic interpretation by expanding a variable to an expression. Through the semantic processor, each assignment is propagated to expressions that reference the assigned variable. Thus, the last expression depends only on loop variables and can be easily evaluated. Each recursive variable is represented by a special expression that calculates the value recursively.

The MTL compiler assumes that the programming patterns of the test program are almost stateless (e.g., there is no historical record or historical state) so that each device access line can be converted into a repeat tree independently. Compression can be performed during merging of the repeat trees generated from multiple device access timing generation modules for one pin. If there is a recursive variable in the test program, for example, a=a+3, it can be optimized by the semantic processor to a=$a_{init}$+3*I, wherein "$a_{init}$" represents an initial value of the variable a, and "I" represents an index of recursion times. In this example, the expression a=a+3 for the recursive variable a is stateful (e.g., there is a historical record or historical state) programming pattern, and thus calculation of the variable a relies on the historical state of a. By converting the expression of the recursive variable "a" into a=$a_{init}$+3*I, the converted expression becomes stateless. At this time, the value of a can be calculated based only on the initial value $a_{init}$ and the recursion time I, without relying on any historical value of a.

However, if a recursive variable cannot be converted into a stateless expression, it will be calculated recursively, which is very slow.

In addition, as the conventional solution for a per-pin MTL compiler needs to expand the variable to a corresponding expression using a semantic processor. However, scalability is unfortunately limited. When test patterns (programming patterns of a test program) become more complex, the compiling time and memory (internal memory) consumption increase sharply.

For example, when using a PRBS (Pseudo Random Binary Sequence) to test a DDR4 SDRAM (Double-Data-Rate Fourth Generation Synchronous Dynamic Random Access Memory), it may be impossible for a conventional MTL compiler to accomplish compilation of DDR4 PRBS test patterns because the PRBS test pattern has complex recursive variables and complex logic and the compilation may require more than 100 G free memory on a workstation.

In test of SoC chip, the logic in the test patterns becomes more and more complex, and registers are simulated in patterns, which are very different from traditional stateless memory test patterns. That is, the patterns used to simulate registers are stateful. In this case, compiling the test patterns consumes substantial memory (several Giga Bytes, for example) on a workstation, and the compiling time is long, for example, more than 1 hour.

SUMMARY

Therefore it would be advantageous to provide a mechanism that can compile a complex test program with high efficiency.

Embodiments of the present disclosure employ a memory test language compiler that comprises a fast semantic processor for interpreting programming patterns in a test program. The fast semantic processor can convert stateful patterns into stateless patterns and then generate an output based on the stateless patterns in a device access timing generation module. The fast semantic processor can generate a closure for a device access line as the output. In the state of the closure, each device access line is in a closed state. The fast semantic processor can generate a standalone tree from an abstract syntax tree of the test program and calculate interdependency of the variables in the test program according to the standalone tree. Loop dependency for each assignment in the test program is calculated according to the standalone tree. A functor is formed from the interdependency of the variables and the loop dependency and a cache is used to handle recursive variables. The functor is propagated to device access lines as output, wherein the functor references the cache when needed.

According to one embodiment of the present disclosure, a method of compiling a test program comprises accessing a test program, generating a standalone tree from the abstract syntax tree of the test program, calculating interdependency of variables in the test program according to the standalone tree, calculating loop dependency for each assignment in the test program according to the standalone tree, forming a functor from the interdependency of the variables and the loop dependency, and using a cache to handle recursive variables, wherein the functor references the cache when needed, and propagating the functor to device access lines as output. The standalone tree may be a duplicate of data of the abstract syntax tree that includes data required for calculating the interdependency of the variables and the loop dependency. The cache may contain calculation history records of the functor. The interdependency of the variables and the loop dependency may be calculated by traversing the standalone tree.

According to another embodiment of the present disclosure, a computer implemented method of compiling test programs comprises: receiving a test program that comprises a stateful pattern; creating a standalone tree from an abstract syntax tree that represents the test program; calculating interdependency of variables in the test program according to the standalone tree; calculating loop dependency for each assignment in the test program according to the standalone tree; and generating a closure for each device access line to convert the stateful pattern to a stateless pattern such that a device access line acts in a close state, wherein the device access line comprises a sequence executable by a test processor.

According to another embodiment of the present disclosure, a system comprises a processor and a memory coupled to said processor and comprising instructions that, when executed by said processor, cause the processor to perform a method of compiling a memory test language program. The instructions comprises: a fast semantic processor and a device access timing generation module. The fast semantic process is configured to interpret programming patterns contained in a test program, wherein the interpreting comprises converting stateful patterns into stateless patterns. The device access timing generation module configured to generating an output based on the stateless patterns, wherein the output is executable by a test processor to generate a binary sequence for test.

The embodiments can reduce consumption of workstation memory and can shorten the compiling time significantly.

It is noted that the content of the summary section is only provided as a simplified introduction and are not to be used to interpret or limit the scope of the invention.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DETAILED DESCRIPTION

Figure 1:
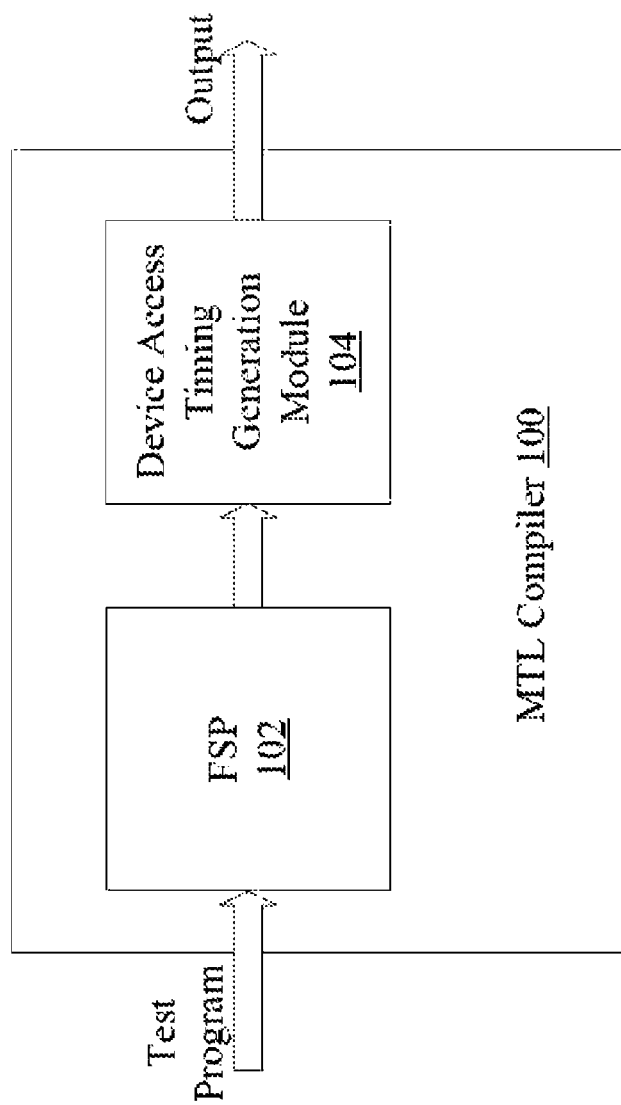
FIG. 1 is a block diagram of an exemplary MTL compiler according to an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or client devices. When a component appears in several embodiments, the use of the same reference numeral signifies that the component is the same component as illustrated in the original embodiment.

To test an integrated circuit (IC) such as a memory or an SoC chip, a test program is first generated and includes various test patterns (sentences). Then in an MTL compiler, the test patterns are converted (interpreted) by a semantic processor and repeat trees are generated by a device access timing generation module.

FIG. 1 shows the block diagram of an exemplary MTL compiler 100 according to an embodiment of the present disclosure. As shown, the MTL compiler 100 includes an FSP (Fast Semantic Processor) 102 and a device access timing generation module 104. A test program is provided to the MTL compiler 100. Although a C-style program is used herein as an exemplary test program, as described above, a test program processed according to the present disclosure can be written in any other suitable language. As is known by a person of ordinary skill in the art, a test program can be represented by an abstract syntax tree.

The FSP 102 can interpret the test program, including converting stateful patterns into stateless patterns. The device access timing generation module 104 can generate an output, e.g., a device access line, based on the stateless patterns.

To convert stateful patterns into a stateless frame, the MTL compiler 100 according to an embodiment utilizes a fast semantic processor (FSP) 102 configured to treat the C-style program as an assignment relationship propagation tree and the device access lines as leaves, thereby forming a decision tree. Therefore, the fast semantic processor for per-pin APG according to an embodiment of the present disclosure can be based on a decision tree.

The FSP 102 can generate a closure for each device access line so that a variable can be evaluated in a "stateless" way. The closure indicates a state in which any other variable or any other loop need not be referenced recursively. In a closure state, each device access line acts in a closed state.

By generating closures, stateful patterns can be converted into stateless patterns, thereby avoiding recursive calculations.

To create a closure, the FSP 102 can trace the assignment from creation of variables to the variable reference in the device access line by creating a standalone tree based on the abstract syntax tree. Loop dependency makes the tracing very complex and difficult. The standalone tree may be a duplicate of the abstract syntax tree, but does not need to include all information of the abstract syntax tree. Instead, it may include only the data required for calculation of variable interdependency and loop dependency as below.

Figure 2:
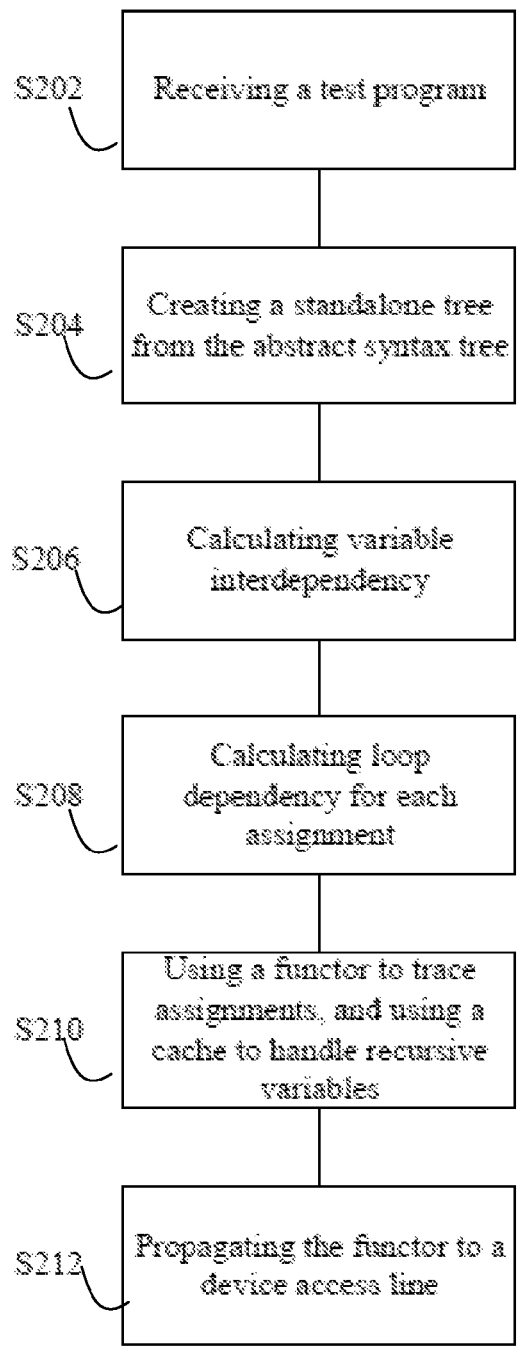
FIG. 2 is a flow chart of an exemplary method for compiling a test program according to an embodiment of the present disclosure.

FIG. 2 shows a flow chart of a method 200 for compiling a test program according to an embodiment. In step S202, the MLT compiler 100 accesses a test program, for example, a C-style program. As described above, an abstract syntax tree can be generated from the test program.

Then in step S204, a standalone tree is created from the abstract syntax tree. For example, the standalone tree includes data duplicated from the abstract syntax tree and needed for calculating variable interdependency and loop dependency herein below.

In step S206, interdependency of variables in the test program is calculated. The calculation is performed based on the standalone tree, for example, by traversing the standalone tree. The interdependency of variables may be determined according to the assignment relationship among different variables as defined by the test program. For example, based on the assignment relationship expressed as a=b+c, the interdependency between a and b, c can be calculated.

In step S208, loop dependency is calculated for each assignment in the test program. The loop dependency refers to the dependency among different loops. The calculation is also performed based on the standalone tree, for example, by traversing the standalone tree.

In step S210, a functor is used to trace assignments and a cache is used to handle recursive variables, wherein the cache is referenced by functors when needed. In particular, a functor is used as a container for tracing assignments, which contains interdependency of variables and loop dependency. That is, a functor is formed based on interdependency of variables and loop dependency. The use of the cache removes recursive calculation of recursive variables. For example, if a recursive variable is calculated by 10 loops, the calculation result of each loop will be regarded as a breakpoint, and values of 10 breakpoints are all stored in the cache. In fact, the cache stores calculation records of the respective functors. Thus, when a functor requires a certain loop of a recursive variable, only a calculation history record (also referred to as a breakpoint value) corresponding to the loop needs to be referenced from the cache. By utilization of functors, it is unnecessary for the variable to be expanded to an expression. By utilization of the cache, recursive calculations are not required any longer.

In step S212, the functor is propagated to device access lines as outputs. The device access lines are outputs of the MTL compiler for the respective pins.

In this way, the MTL compiler 100 generates repeat trees to be executed by the test processor, and then the test processor executes the repeat trees to generate the binary sequence for test. The steps S204 to S212 shown in FIG. 2 can be performed by the FSP 102 or any other suitable circuits.

The pattern vector file (binary sequence) generated by an MTL compiler according to the present disclosure can be identical to that generated by a conventional MTL compiler.

Therefore, the MTL compiler according to an embodiment of the present invention has the same effect as the conventional MTL compiler.

The binary sequence for a test is provided to a DUT via an excitation signal generation module, and then the DUT outputs a process result. The process result is compared with an expected result to determine whether the DUT can operate properly. If the process result is different from the expected result, a fault in the DUT can be declared.

In order to locate a fault point in the DUT, reconstruction needs to be performed. For example, reconstruction functions can be generated by the MTL compiler and stored in a reconstruction library. The reconstruction functions generated by the MTL compiler according to an embodiment of the present disclosure are improved so that the execution time spent on calculating fault address from a cycle number advantageously decreases.

In an embodiment, a cache is used which deviates the need for recursive calculation. The result is shared among respective pins, thereby reducing compiling time. In addition, by using functors, expanding a variable to an expression is no longer needed, thereby reducing the memory consumption for compiling and shortening the compiling time.

The cache also shortens the reconstruction time in pattern execution. Furthermore, the functor and cache allow more optimization to be introduced, for example, JIT (Just-In-Time) compilation with LLVM (Low-Level Virtual Machine).

Specific examples will be given hereinafter to illustrate the improvement on memory consumption and compiling time by the MTL compiler with FSP according to an embodiment.

Table 1 shows an example result of compiling a PRBS pattern for testing DDR4 SDRAM (Double-Data-Rate Fourth Generation Synchronous Dynamic Random Access Memory).

TABLE 1

|  | Memory Consumption on Workstation | Compiling Time |
| --- | --- | --- |
| Conventional MTL Compiler | >96G Bytes | N/A (cannot finish compiling) |
| MTL Compiler with Fast Semantic Processor | 33M Bytes | 6 Seconds |

As can be seen from Table 1, the conventional MTL compiler cannot finish compiling the PRBS pattern because the memory needed exceeds the available memory on the workstation. In contrast, the compilation can be accomplished within 6 seconds with 33M Bytes of workstation memory by the MTL compiler with FSP according to an embodiment of the present disclosure. The consumption of memory and the compiling time are both significantly reduced.

Table 2 shows another example result of compiling a PRBS pattern.

TABLE 2

|  | Memory Consumption on Workstation | Compiling Time |
| --- | --- | --- |
| Conventional MTL Compiler | 2189M Bytes | 1249 Seconds |
| MTL Compiler with Fast Semantic Processor | 68M Bytes | 5 Seconds |

As can be seen from Table 2, in the example, 2189M Bytes of workstation memory is consumed for the conventional MTL compiler to finish compiling the PRBS pattern and the compiling time is 1249 seconds. In contrast, only 68M Bytes of workstation memory is consumed by the MTL compiler with FSP according to an embodiment of the present disclosure and the compiling time is as short as 5 seconds.

Table 3 shows yet another example result of compiling a PRBS pattern.

TABLE 3

|  | Memory Consumption on Workstation | Compiling Time |
| --- | --- | --- |
| Conventional MTL Compiler | 5758M Bytes | 4764 Seconds |
| MTL Compiler with Fast Semantic Processor | 93M Bytes | 9 Seconds |

As can be seen from Table 3, in the example, 5758M Bytes of workstation memory is consumed for the conventional MTL compiler to finish compiling the PRBS pattern and the compiling time is 4764 seconds. In contrast, only 93M Bytes of workstation memory is consumed by the MTL compiler with FSP according to an embodiment of the present disclosure and the compiling time is as short as 9 seconds.

The pattern used for testing an SoC may be very complicated, especially an SoC chip with registers. Such a scenario is simulated herein. The program code in the example case is as follows:

```
a=11, b=12, c=13, d=14;
main ( ){
    for (k1=0;k1<3;k1++){
    for (k2=0;k2<3;k2++){
    for (k3=0;k3<3;k3++){
    for (k4=0;k4<3;k4++){
        for (y=0;y<8;y+=2) {
            b=a+1;c=b+1;d=c+1;a=d+1;    acc0 (a,b,c,d);
            for (z=0;z<8;z+=2) {
                b=b+1;c=c+1;    acc0 (a,b,c,d)
                for (j=0;j<9;j+=2) {
                    a=a+1; d=d+1;        acc-(a,b,c,d);
                    for (i=0;i<8; i+=2) {
                        a=b+1; b=c+1; c=d+1;d=a+1;
                        acc0 (a,b,c,d);
                    }
                    a=a+1;    acc0 (a,b,c,d);
                }
                b=c+1; c=d+1;        acc0 (a,b,c,d);
}}}}}}
```

The program code is compiled with the conventional MTL compiler and the MTL compiler according to an embodiment of the present disclosure respectively. The results are compared in Table 4.

TABLE 4

| | Memory Consumption on Workstation | Compiling Time | Reconstruction Time (34020 cycles * 2 pins) |
|---|---|---|---|
| Conventional MTL Compiler | 256M Bytes | 96 Seconds | 87.34 Seconds |
| MTL compiler with Fast Semantic Processor | 13M Bytes | 1 Second | 0.16 Seconds |

As can be seen from Table 4, in the example, 256M Bytes of workstation memory is consumed for the conventional MTL compiler to finish compiling the SoC pattern and the compiling time is 96 seconds. In contrast, only 13M Bytes of workstation memory is consumed by the MTL compiler with FSP according to an embodiment of the present disclosure and the compiling time is as short as 1 second. Moreover, for the reconstruction process with 34,020 cycles of 2 pins, the reconstruction time used by the conventional MTL compiler is 87.34 seconds, while the reconstruction time by using the MTL compiler according to an embodiment of the present disclosure is 0.16 seconds.

As can be seen, the MTL compiler with a fast semantic processor according to an embodiment of the present disclosure advantageously significantly reduces consumption of workstation memory and shortens the compiling time and reconstruction time, thereby improving compiling efficiency.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A non-transitory computer-readable storage medium embodying instructions that, when executed by a processing device, implements a test program compiler, said test program compiler comprising:
   a fast semantic processor configured to perform interpreting of programming test patterns for testing an integrated circuit through an automated test equipment (ATE), wherein the test patterns are contained in a test program, wherein the interpreting comprises converting stateful patterns into stateless patterns; and
   a device access timing generation module configured to generate an output based on the stateless patterns, wherein the output is executable by a test processor to generate a binary sequence for testing an integrated circuit device, wherein the fast semantic processor is free of recursive calculation of recursive variables.

2. The non-transitory computer-readable storage medium of claim 1, wherein the fast semantic processor is configured to generate a closure for a device access line as the output, wherein the device access line corresponds to a test pin of the integrated circuit device, and wherein, in a state of the closure, each device access line is in a closed state.

3. The non-transitory computer-readable storage medium of claim 2, wherein the fast semantic processor is further configured to:
   generate a standalone tree from an abstract syntax tree that represents the test program;
   calculate interdependency of variables in the test program according to the standalone tree;
   calculate loop dependency for each assignment in the test program according to the standalone tree; and
   form a functor comprising the interdependency of the variables and the loop dependency.

4. The non-transitory computer-readable storage medium of claim 3, wherein the standalone tree only comprises data for calculating the interdependency of variables and the loop dependency.

5. The non-transitory computer-readable storage medium of claim 3, wherein the fast semantic process is further configured to:
   use a cache to store a calculation history of recursive variables defined by the test program; and
   propagate the functor to device access lines as output, and wherein the functor is operable to reference the cache for a breakingpoint value of a calculation loop of a recursive variable.

6. The non-transitory computer-readable storage medium of claim 3, wherein the interdependency of variables is calculated according to assignment relationship among different variables defined in the test program.

7. The non-transitory computer-readable storage medium of claim 3, wherein the interdependency of variables is calculated by traversing the standalone tree.

8. A computer implemented method of compiling test programs, said method comprising:
   receiving a test program that comprises a stateful pattern, wherein the test program is configured for testing an integrated circuit through an automated test equipment (ATE);
   creating a standalone tree from an abstract syntax tree that represents the test program;
   calculating interdependency of variables in the test program according to the standalone tree;
   calculating loop dependency for each assignment in the test program according to the standalone tree; and
   generating a closure for each device access line to convert the stateful pattern to a stateless pattern such that a device access line acts in a close state, wherein the device access line comprises a sequence executable by a test processor.

9. The computer implemented method of claim 8, wherein the generating the closure comprises:
   forming a functor based on the interdependency of the variables and the loop dependency; and
   using a cache to handle recursive variables, wherein the functor is operable to reference the cache when needed; and
   propagating the functor to device access lines as output.

10. The computer implemented method of claim 8, wherein the standalone tree includes data for calculating the interdependency of the variables and the loop dependency, and wherein the data is obtained from the abstract syntax tree.

11. The computer implemented method of claim 9, wherein the cache contains calculation history records of the functor.

12. The computer implemented method of claim 8, wherein the interdependency of the variables and the loop dependency are calculated by traversing the standalone tree.

13. A system comprising:
   a processor;
   a memory coupled to said processor and comprising instructions that, when executed by said processor, cause the processor to perform a method of compiling a memory test language program, the instructions comprising:

a fast semantic processor configured to:
   interpret programming patterns contained in a test program that is configured for testing an integrated circuit through an automated test equipment (ATE), wherein interpreting the programming patterns comprises converting stateful patterns into stateless patterns;
   generate a closure for a device access line as the output, and in the state of a closure, each device access line is in a closed state;
   generate a standalone tree from an abstract syntax tree that represents the test program;
   calculate interdependency of variables in the test program according to the standalone tree;
   calculate loop dependency for each assignment in the test program according to the standalone tree; and
   form a functor containing the interdependency of the variables and the loop dependency; and a device access timing generation module configured to generating an output based on the stateless patterns, wherein the output is executable by a test processor to generate a binary sequence for test.

14. The system of claim 13, wherein the standalone tree only comprises data for calculating the interdependency of variables and the loop dependency.

15. The system of claim 13, wherein the fast semantic process is further configured to use a cache to store calculation history of recursive variables and propagate the functor to device access lines as output, and wherein the functor is operable to reference the cache for a breakingpoint value of a calculation loop of a recursive variable.

16. The system of claim 13, wherein the interdependency of variables is calculated according to assignment relationship among different variables that are defined in the test program.

17. The system of claim 13, wherein the fast semantic processor is free of recursive calculation of recursive variables.

* * * * *